(12) United States Patent
Zhang et al.

(10) Patent No.: US 11,419,234 B2
(45) Date of Patent: Aug. 16, 2022

(54) PREFABRICATING AND STACKING COMBINED DATA CENTER AND ASSEMBLING METHOD THEREOF

(71) Applicant: Shanghai Data Center Science Co., Ltd, Shanghai (CN)

(72) Inventors: Jun Zhang, Shanghai (CN); Bin Wang, Shanghai (CN); Ting Zhao, Shanghai (CN)

(73) Assignee: Shanghai Data Center Science Co., Ltd, Shanghai (CN)

( * ) Notice: Subject to any disclaimer, the term of this patent is extended or adjusted under 35 U.S.C. 154(b) by 96 days.

(21) Appl. No.: 16/754,836

(22) PCT Filed: Apr. 2, 2019

(86) PCT No.: PCT/CN2019/081056
§ 371 (c)(1),
(2) Date: Apr. 9, 2020

(87) PCT Pub. No.: WO2020/186556
PCT Pub. Date: Sep. 24, 2020

(65) Prior Publication Data
US 2021/0168963 A1    Jun. 3, 2021

(30) Foreign Application Priority Data

Mar. 20, 2019    (CN) .......................... 201910213838.1

(51) Int. Cl.
*H05K 7/00*       (2006.01)
*H05K 7/14*       (2006.01)
*H05K 5/00*       (2006.01)

(52) U.S. Cl.
CPC ......... *H05K 7/1487* (2013.01); *H05K 5/0021* (2013.01); *H05K 7/1495* (2013.01)

(58) Field of Classification Search
None
See application file for complete search history.

(56) References Cited

U.S. PATENT DOCUMENTS

2007/0213000 A1* 9/2007 Day .................. H05K 7/20754
                                                      361/695
2008/0055846 A1* 3/2008 Clidaras .............. H05K 7/2079
                                                      361/679.41

(Continued)

FOREIGN PATENT DOCUMENTS

CN      102625622 A      8/2012
CN      204498526 U      7/2015

(Continued)

OTHER PUBLICATIONS

International Search Report of the International Searching Authority, along with an English translation, dated May 30, 2019, issued in connection with International Application No. PCT/CN2019/081056/002875 (5 pages).

(Continued)

*Primary Examiner* — Anthony Q Edwards
*Assistant Examiner* — Rashen E Morrison
(74) *Attorney, Agent, or Firm* — McCarter & English, LLP

(57) ABSTRACT

Disclosed is a prefabricating and stacking combined data center. The data center is formed block structures in a multi-dimensional stacking manner. The block structures are disposed to be a fire protection layer, an air return layer, a bridge architecture wiring layer, a top-cabinet wiring layer, a cabinet device layer, and an air supply layer from up to down, which are independent from each other. Provided is a prefabricating and stacking combined data center. Operation difficulty of site construction is greatly reduced by prefabricating block structures by a factory, forming the data center by multi-dimensional stacking, and connecting the block (Continued)

structures with each other by splicing on site. In addition, according to different requirements of customers, corresponding ancillary facilities may be designed based on volume of an IT device, and the device and a computer room may be reasonably and effectively arranged according to the corresponding national standards and specifications.

7 Claims, 3 Drawing Sheets

(56) References Cited

U.S. PATENT DOCUMENTS

| | | | | |
|---|---|---|---|---|
| 2009/0216381 | A1* | 8/2009 | Gooch | A62C 3/16 |
| | | | | 700/277 |
| 2011/0307102 | A1* | 12/2011 | Czamara | H05K 7/1497 |
| | | | | 700/282 |
| 2011/0316337 | A1* | 12/2011 | Pelio | H05K 7/1492 |
| | | | | 307/24 |
| 2012/0092811 | A1* | 4/2012 | Chapel | G06F 11/3051 |
| | | | | 361/622 |
| 2012/0255710 | A1* | 10/2012 | Maselli | E04H 5/02 |
| | | | | 165/80.2 |
| 2016/0021793 | A1* | 1/2016 | Chen | H05K 7/202 |
| | | | | 361/679.02 |
| 2017/0013745 | A1* | 1/2017 | Wilcox | H05K 7/1492 |
| 2017/0359917 | A1* | 12/2017 | Bailey | H05K 7/1485 |
| 2019/0171799 | A1* | 6/2019 | Crawford | H05K 7/1495 |
| 2019/0261534 | A1* | 8/2019 | Jochim | H05K 7/1492 |
| 2020/0146186 | A1* | 5/2020 | Fotouh | E04B 2/7401 |
| 2020/0265175 | A1* | 8/2020 | Martin | G06F 3/0482 |
| 2021/0076529 | A1* | 3/2021 | Pachoud | H01R 24/20 |
| 2021/0219460 | A1* | 7/2021 | Bailey | H05K 7/1481 |

FOREIGN PATENT DOCUMENTS

| | | |
|---|---|---|
| CN | 205082104 U | 3/2016 |
| CN | 106165019 A | 11/2016 |
| CN | 206061366 U | 3/2017 |
| CN | 206771602 U | 12/2017 |
| CN | 107734919 A | 2/2018 |

OTHER PUBLICATIONS

First Office Action, along with an English translation, dated Jun. 18, 2020, issued by The State Intellectual Property Office of People's Republic of China in connection with Chinese Patent Application No. 201910213838.1 (14 pages).

* cited by examiner

PREFABRICATING AND STACKING COMBINED DATA CENTER AND ASSEMBLING METHOD THEREOF

CROSS-REFERENCE TO RELATED APPLICATIONS

This is a National Stage Application, filed under 35 U.S.C. 371, of International Patent Application No. PCT/CN2019/081056, filed on Apr. 2, 2019, which claims priority to Chinese patent application No. 201910213838.1 filed on Mar. 20, 2019, the contents of both of which are incorporated herein by reference in their entireties.

TECHNICAL FIELD

The present disclosure relates to the technical field of computers, and more specifically, a prefabricating and stacking combined data center and an assembling method thereof.

BACKGROUND

With the rapid development of the Internet industry, the scale of data centers continues to expand. Today, with rapid changes, stable infrastructure construction serves as a cornerstone for the continued growth of Internet companies, and a rapid and efficient construction of data center has become a special concern.

Modularly designed data centers on the market at present productizine and integrate the work of part of engineering construction links into the design of the device, and each product is shipped independently and packaged independently. However, there are still the following shortcomings. A large amount of on-site construction and installation work is needed, application effect of the data center is directly affected by installation quality, and a lot of packaging materials are wasted. The overall modular integration is low, the amount of site workload is too large, and the installation process is too slow.

In addition, there are containerized data centers on the market completing the design, production, construction, commissioning and other tasks in the factory. Users merely need to complete the necessary power supply and communication connections to use. However, there are also some unfavorable factors. It is necessary to prefabricate a fixed storage space for the entire container. Outdoor and roof placement needs to design necessary independent lightning protection. The modular integration is too high and the installation is not flexible. At the same time, a container box has increased investment of the data center and lengthened an investment recovery period.

Therefore, how to provide a data center with simple installation and prefabricated external device according to requirements of a customer and an assembly method of the data center is an issue that needs to be solved by those skilled in the art.

SUMMARY

In view of this, the present disclosure provides a prefabricating and stacking combined data center. Operation difficulty of site construction is greatly reduced by prefabricating block structures by a factory, forming the data center by multi-dimensional stacking, and connecting the block structures with each other by splicing on site. In addition, according to different requirements of customers, corresponding ancillary facilities may be designed based on volume of an IT device, and the device and a computer room may be reasonably and effectively arranged according to the corresponding national standards and specifications.

To achieve the above-mentioned object, the present disclosure provides a prefabricating and stacking combined data center. The data center is formed block structures in a multi-dimensional stacking manner. The block structures are arranged from up to down to be a fire protection layer, an air return layer, a bridge architecture wiring layer, a top-cabinet wiring layer, a cabinet device layer, and an air supply layer, which are independent from each other.

Through the above-mentioned technical solutions, the technical effects of the present disclosure are as follows. Operation difficulty of site construction is greatly reduced by prefabricating block structures by a factory, forming the data center by multi-dimensional stacking, and connecting the block structures with each other by splicing on site. In addition, according to different requirements of customers, corresponding ancillary facilities may be designed based on volume of an IT device, and the device and a computer room may be reasonably and effectively arranged according to the corresponding national standards and specifications.

In one embodiment, the prefabricating and stacking combined data center further includes a power supply module, a cooling module, and a fire protection system. The power supply module is connected to the bridge architecture wiring layer, the top-cabinet wiring layer, and the cabinet device layer, respectively. The cooling module is in communication with the air return layer and the air supply layer; and the fire protection system is connected to the fire protection layer.

In one embodiment, for the prefabricating and stacking combined data center, the block structures are assembled with each other on-site.

In one embodiment, for the prefabricating and stacking combined data center, each block structure is spliced up, down, left, or right in the multi-dimensional stacking manner.

In one embodiment, for the prefabricating and stacking combined data center, heights of the cabinet device layer, the top-cabinet wiring layer, the bridge architecture wiring layer, and the fire protection layer are constant; and heights of the air supply layer and the air return layer are determined based on project requirements.

In one embodiment, for the prefabricating and stacking combined data center, the block structures are prefabricated and spliced by the factory.

Provided is an assembling method for a prefabricating and stacking combined data center, the specific steps are included as follows.

Step 1: the block structures are processes and prefabricated by a factory, and placed on a foundation;

Step 2: the block structures are fixedly connected to the foundation by cast-in-place; and Step 3: multi-dimensional stacking is performed, devices are installed, and establishment of the data center is completed.

It can be known from the above-mentioned technical solutions that compared with the related art, the present disclosure provides a prefabricating and stacking combined data center and an assembly method thereof. Operation difficulty of site construction is greatly reduced through prefabricating block structures by a factory, forming the data center by multi-dimensional stacking, and connecting the block structures by splicing on site. In addition, according to different requirements of customers, corresponding ancillary facilities may be designed based on volume of an IT device, and the device and a computer room may be reasonably and effectively arranged according to the corresponding national standards and specifications.

Compared with the related art, the present disclosure has the following technical effects. By combining prefabrication and stacking and employing prefabricated block structures for stacking, the industrialization of the building may be improved, the building construction cycle is shorten, green construction is realized, construction waste and building dust is effectively control during the construction, and the goals of water saving, power saving, material saving, energy saving, and time saving are achieved. Different energy saving index requirements may be achieved based on requirements, so as to meet the social requirements for energy saving and environmental protection during the construction and use of buildings. And the present disclosure changes the construction of the existing traditional data center to achieve a purpose of large-scale intensive production, thereby improving the establishment efficiency of data center.

BRIEF DESCRIPTION OF DRAWINGS

To illustrate the embodiments of the present disclosure or the existing art more clearly, drawings used in the description of the embodiments or the related art will be briefly described below. Apparently, the drawings described below are merely embodiments of the present disclosure, and those skilled in the art may obtain other drawings based on provided drawings on the premise that no creative work is done.

DETAILED DESCRIPTION

Figure 1:
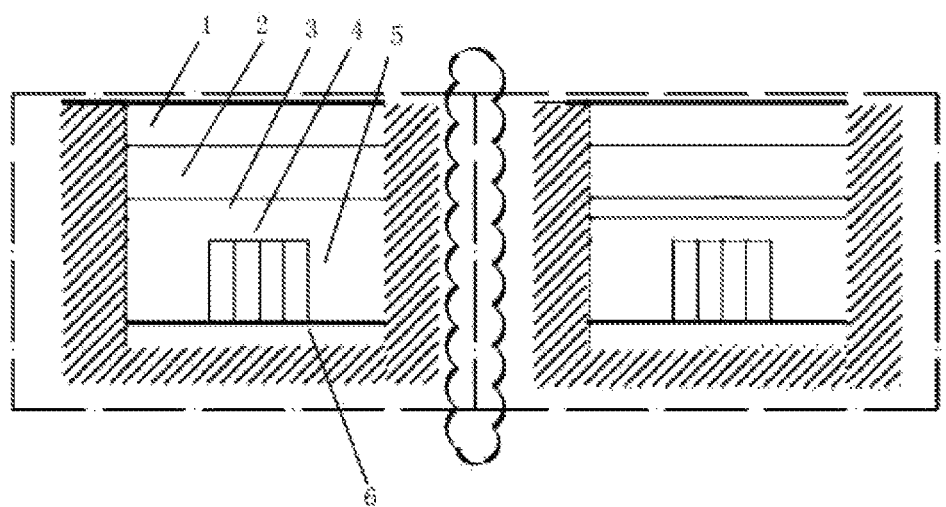
FIG. 1 is a cross-sectional view illustrating block structures of the present disclosure.
Figure 2:
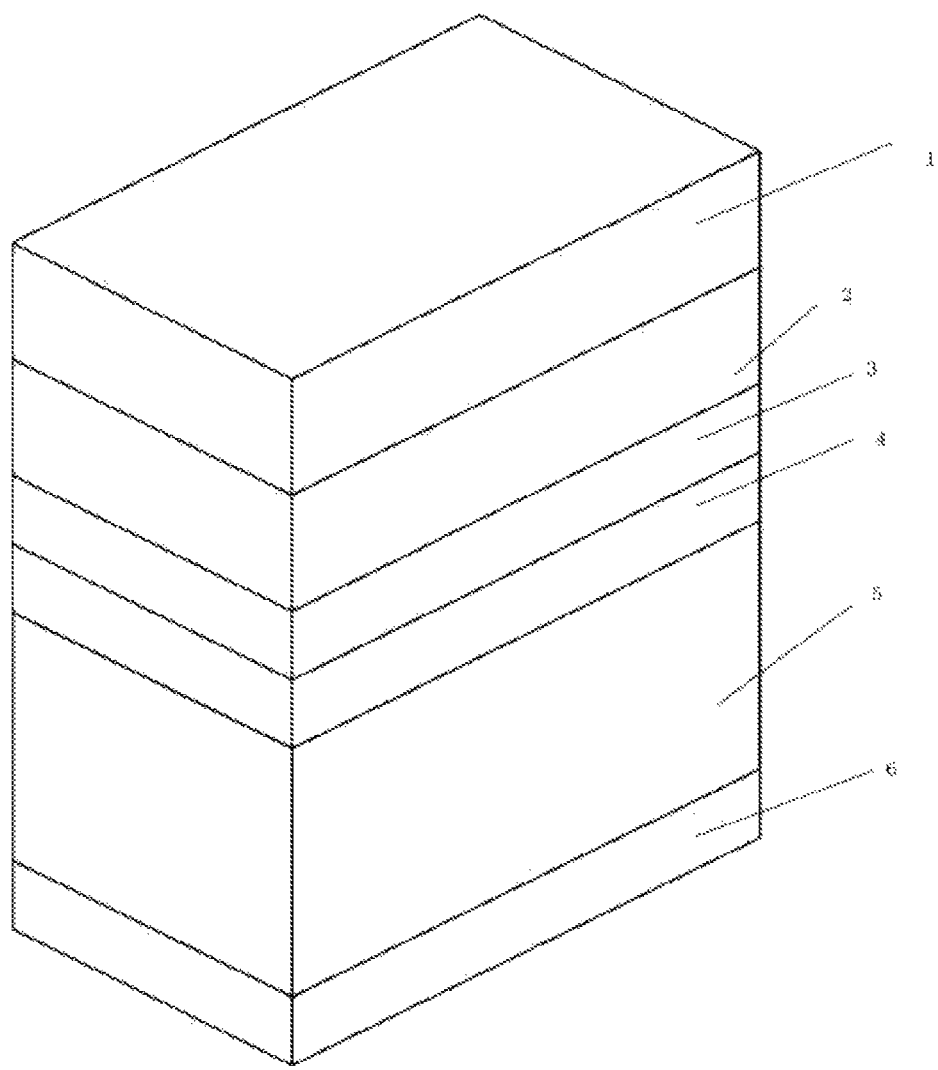
FIG. 2 is a perspective view illustrating the block structures of the present disclosure.
Figure 3:
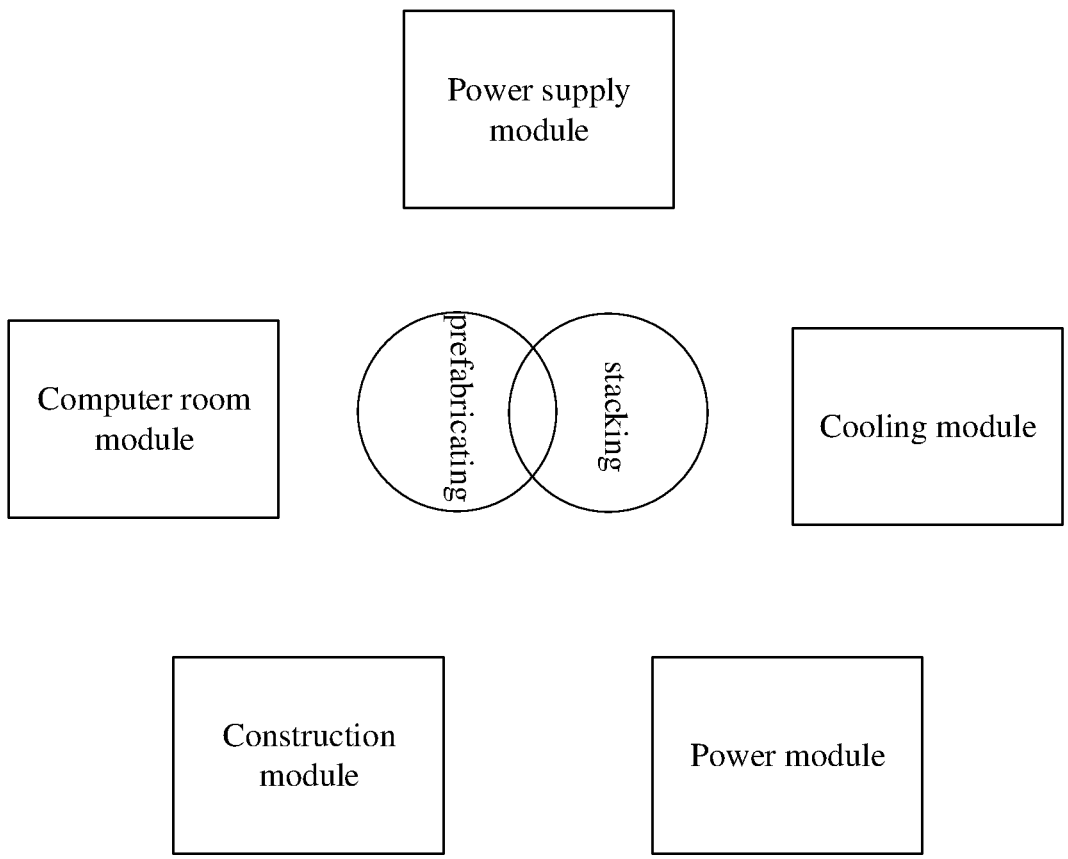
FIG. 3 is a schematic view of the present disclosure.

Hereinafter the embodiments of the present disclosure will be described clearly and completely in conjunction with the accompanying drawings. Apparently, the embodiments described below are part, not all, of the embodiments of the present disclosure. Based on the embodiments of the present disclosure, all other embodiments obtained by those skilled in the art without creative work are within the scope of the present disclosure.

Embodiments of the present disclosure disclose a prefabricating and stacking combined data center and an assembling method thereof. Operation difficulty of site construction is greatly reduced through prefabricating block structures by a factory, forming the data center by multi-dimensional stacking, and connecting the block structures with each other by splicing on site. In addition, according to different requirements of customers, corresponding ancillary facilities may be designed based on volume of an IT device, and the device and a computer room may be reasonably and effectively arranged according to the corresponding national standards and specifications.

Provided is a prefabricating and stacking combined data center, the data center is formed of block structures in a multi-dimensional stacking manner. The block structures are arranged from up to down to be a fire protection layer 1, an air return layer 2, a bridge architecture wiring layer 3, a top-cabinet wiring layer 4, a cabinet device layer 5, and an air supply layer 6, which are independent from each other.

In another embodiment, the air supply layer 6 is used to transport cold air to a vertical layered model.

The cabinet device layer 5 is used to arrange and place an IT device required for the data center.

The cabinet wiring layer 4 is used to arrange and place a device required for comprehensive wiring.

The cabinet wiring layer 3 is used to arrange and place a device required for electric.

The air return layer 2 is used to circulate air transported by the air supply layer 6 and re-cool the cabinet device layer 5, the top-cabinet wiring layer 4 and the bridge architecture wiring layer 3.

The fire protection layer 1 is used to provide fire protection measures.

In another embodiment, the data center further includes a power supply module, a cooling module, and a fire protection system. The power supply module is connected to a device of the cabinet device layer 5, the bridge architecture wiring layer 3, and the top-cabinet wiring layer 4, respectively. The cooling module is in communication with the air return layer 2 and the air supply layer 6. The fire protection system is connected to the fire protection layer 1.

In another embodiment, the power supply module is used to provide safe and reliable power for the cooling module and the fire protection system.

The cooling module is used to cool a preset module.

The data center further includes a dynamic ring device, used to real-time monitor and collect data information of all devices and the environment.

In another embodiment, the block structures are assembled with each other on-site.

In another embodiment, each block structure is spliced up, down, left, or right in the multi-dimensional stacking manner.

In another embodiment, heights of the cabinet device layer 5, the top-cabinet wiring layer 4, the bridge architecture wiring layer 3, and the fire protection layer 1 are constant.

In another embodiment, the block structures are prefabricated and spliced by the factory.

Provided is an assembling method for a prefabricating and stacking combined data center, the specific steps are included as follows.

Step 1: the block structures are processed and prefabricated by a factory, and placed on a foundation.

Step 2: the blocks structure are fixedly connected to the foundation by cast-in-place.

Step 3: multi-dimensional stacking is performed, devices are installed, and establishment of the data center is completed. Embodiments in this specification are described in a progressive manner. Each embodiment focuses on differences from other embodiments. The same or similar parts in the embodiments can be referred to by each other. As for the device disclosed in the embodiment, since corresponding to the method disclosed in the embodiment, description of the device is relatively simple, and the relevant part may refer to the description of the method.

The above description of the disclosed embodiments enables those skilled in the art to implement or use the present disclosure. Various modifications to these embodiments will be apparent to those skilled in the art, and the general principles defined herein may be implemented in other embodiments without departing from the spirit or scope of the disclosure. Therefore, the present disclosure is not intended to be limited to the embodiments shown herein but is to be accorded the widest scope consistent with the principles and novel features disclosed herein.

What is claimed is:

1. A prefabricating and stacking combined data center, wherein the data center is formed of block structures in a multi-dimensional stacking manner; the block structures are arranged from up to down to be a fire protection layer, an air return layer, a bridge architecture wiring layer, a top-cabinet wiring layer, a cabinet device layer, and an air supply layer; and the fire protection layer, the air return layer, the bridge architecture wiring layer, the top-cabinet wiring layer, the cabinet device layer, and the air supply layer each are a block structure, and are independent from each other and spliced in sequence.

2. The prefabricating and stacking combined data center of claim 1, further comprising a power supply module, a cooling module, and a fire protection system; wherein the power supply module is connected to the bridge architecture wiring layer, the top-cabinet wiring layer, and a device of the cabinet device layer respectively; the cooling module is in communication with the air return layer and the air supply layer; and the fire protection system is connected to the fire protection layer.

3. The prefabricating and stacking combined data center of claim 1, wherein the block structures are assembled with each other on-site.

4. The prefabricating and stacking combined data center of claim 1, wherein each block structure is spliced up, down, left, or right in the multi-dimensional stacking manner.

5. The prefabricating and stacking combined data center of claim 1, wherein heights of the cabinet device layer, the top-cabinet wiring layer, the bridge architecture wiring layer, and the fire protection layer are constant.

6. The prefabricating and stacking combined data center of claim 1, wherein the block structures are prefabricated by a factory.

7. An assembling method for a prefabricating and stacking combined data center, wherein the prefabricating and stacking combined data center is formed of blocks structures in a multi-dimensional stacking manner; the block structures are arranged from up to down to be a fire protection layer, an air return layer, a bridge architecture wiring layer, a top-cabinet wiring layer, a cabinet device layer, and an air supply layer; and the fire protection layer, the air return layer, the bridge architecture wiring layer, the top-cabinet wiring layer, the cabinet device layer, and the air supply layer each are a block structure, and are independent from each other and spliced in sequence, the assembling method comprising:

step 1: processing and prefabricating the block structures by a factory, and placing the block structures on a foundation;

step 2: fixedly connecting the block structures to the foundation by cast-in-place; and step 3: performing multi-dimensional stacking, installing devices, and completing establishment of the data center.

* * * * *